United States Patent
Gupta et al.

(10) Patent No.: US 11,621,715 B1
(45) Date of Patent: Apr. 4, 2023

(54) COARSE EQUALIZER ADAPTATION AND RATE DETECTION FOR HIGH-SPEED RETIMERS

(71) Applicant: TEXAS INSTRUMENTS INCORPORATED, Dallas, TX (US)

(72) Inventors: Robin Gupta, Santa Clara, CA (US); Abishek Manian, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/573,144

(22) Filed: Jan. 11, 2022

(51) Int. Cl.
```
H03H 7/30       (2006.01)
H03H 7/40       (2006.01)
H03K 5/159      (2006.01)
H03L 7/08       (2006.01)
H03L 7/087      (2006.01)
H04L 7/033      (2006.01)
```
(52) U.S. Cl.
CPC ............ *H03L 7/0807* (2013.01); *H03L 7/087* (2013.01); *H04L 7/0337* (2013.01)

(58) Field of Classification Search
CPC ..... H03L 7/0807; H03L 7/087; H03L 7/0898; H04L 7/0337; H04L 7/033; H04L 25/03057; H04L 25/0272
USPC .......................... 375/229, 232–234, 373–376
See application file for complete search history.

(56) References Cited

U.S. PATENT DOCUMENTS

| | | | |
|---|---|---|---|
| 5,315,270 A * | 5/1994 | Leonowich | H03L 7/0898 331/25 |
| 7,158,601 B1 * | 1/2007 | Chew | H04L 7/033 375/376 |
| 8,879,618 B2 * | 11/2014 | Abdalla | H04L 25/0272 375/233 |
| 10,069,654 B2 * | 9/2018 | Sadeghi-Emamchaie | H04L 25/03057 |
| 2004/0258183 A1 * | 12/2004 | Popescu | H04L 7/033 375/350 |
| 2022/0085967 A1 | 3/2022 | Vrazel | |

* cited by examiner

*Primary Examiner* — Phuong Phu
(74) *Attorney, Agent, or Firm* — Valerie M. Davis; Frank D. Cimino

(57) ABSTRACT

Systems, circuitry and methods measure data transition metrics of incoming data, average the measurements of each metric at a set time interval for multiple intervals to generate multiple averaged values, and select a maximum of the multiple averaged values for each metric. The maximum values of each measurement cycle are compared with corresponding multiple thresholds defining respective ranges, and the outputs are used by a state machine to determine an equalization level and the rate of the incoming data. When the thresholds are not met, the state machine adjusts the equalization level, and when a sub-rate is detected using a third threshold for one of the metrics, the clock rate is also adjusted. Locking of a clock and data recovery (CDR) circuit is attempted when the maximum values for each metric are within their respective ranges.

22 Claims, 6 Drawing Sheets

COARSE EQUALIZATION

| EQ INDEX | DTD COUNT | | | | SBT COUNT | | | |
|---|---|---|---|---|---|---|---|---|
| | 5m | 50m | 70m | 105m | 5m | 50m | 70m | 105m |
| 0 | 447 | 204 | 182 | 219 | 201 | 55 | 58 | 96 |
| 1 | 452 | 363 | 218 | 191 | 192 | 151 | 55 | 72 |
| 2 | 454 | 447 | 324 | 192 | 190 | 200 | 121 | 55 |
| 3 | 511 | 446 | 430 | 209 | 243 | 186 | 191 | 51 |
| 4 | 512 | 440 | 417 | 214 | 236 | 173 | 164 | 37 |
| 5 | 509 | 430 | 383 | 207 | 208 | 162 | 128 | 26 |
| 6 | 509 | 439 | 401 | 308 | 213 | 166 | 141 | 92 |
| 7 | 512 | 453 | 441 | 410 | 268 | 176 | 176 | 192 |

FIG. 6

RATE DETECTION

| EQ INDEX | DTD COUNT | | | SBT COUNT | | |
|---|---|---|---|---|---|---|
| | 50m | 95m | 140m | 50m | 95m | 140m |
| 0 | 194 | 161 | 210 | 33 | 64 | 94 |
| 1 | 232 | 149 | 185 | 11 | 34 | 79 |
| 2 | 232 | 184 | 176 | 3 | 31 | 70 |
| 3 | 233 | 229 | 171 | 2 | 32 | 54 |
| 4 | 233 | 232 | 178 | 2 | 6 | 36 |
| 5 | 233 | 232 | 203 | 3 | 7 | 42 |
| 6 | 234 | 232 | 226 | 2 | 5 | 39 |
| 7 | 233 | 232 | 207 | 2 | 3 | 38 |
| 8 | 233 | 232 | 232 | 1 | 2 | 31 |
| 9 | 250 | 232 | 236 | 9 | 2 | 16 |
| 10 | 352 | 233 | 236 | 55 | 2 | 6 |

FIG. 7

COARSE EQUALIZER ADAPTATION AND RATE DETECTION FOR HIGH-SPEED RETIMERS

FIELD OF DISCLOSURE

This disclosure relates generally to data transition tracking, and more particularly to using data transition metrics obtained from such tracking to determine connection characteristics, e.g., level of equalization and incoming data rate.

BACKGROUND

When a transmitter transmits a data-containing signal (data signal or simply signal), such as a high-speed signal, through a communication channel, e.g., a cable or trace on a PCB, the signal exiting the channel may be distorted relative to the signal entering the channel. For example, the signal output by the transmitter may be a high-speed serial data stream of 0's and 1's, transmitted at or greater than a data rate of 1 Gb/s, where a 0 may represent a relative low voltage, e.g., around −400 mV, and a 1 may represent a relative high voltage of approximately 400 mV. As the high-speed signal propagates, the channel may attenuate higher frequency content of the signal as a function of frequency, thereby acting as a low-pass filter, thus distorting the signal. Distortion compensation circuitry is thus typically included in, or disposed upstream of, the receiver to remove at least some of the distortion in the signal exiting the channel and output a signal for use by the receiver (or other components thereof) that is closer to the signal output by the transmitter.

Signal distortion is of concern in many applications, including serial digital interface (SDI) video re-timer/re-clocker applications that should be able to support all Society of Motion Picture and Television Engineers (SMPTE) data rates, including 270 Mb/s, 1.5 Gb/s, 3 Gb/s, 6 Gb/s and 12 Gb/s without a reference clock in mission mode and without any prior knowledge of the incoming data rate. Such re-timer applications should also support a wide range of cable lengths, ranging from cables of 100 m or less (~58 dB at 6 GHz) at a data rate of 12 Gb/s to cables up to 550 m (~40 dB at 135 MHz) at a 270 Mb/s data rate. Complicating the issue of designing a system that can readily adapt to the incoming data rate and to ensure sufficient equalization for the clock and data recovery (CDR) circuit to quickly and reliably lock within one video frame (~16 ms including equalizer adaptation) is that the input data may have long runs (tens of microseconds) of disruptive data patterns, e.g., repetitive low transition-density pathological patterns of data. For example, the signal for testing automatic cable equalization may cycle between 19 low level bits and 1 high level bit, whereas the signal for testing phase-locked loop (PLL) lock-in may cycle more evenly between 20 high level bits and 20 low level bits.

Conventional SDI re-timers/re-clockers have used an analog energy-based technique to detect data rate. This technique generally involves measuring energy at various frequency bands using programmable analog filters and rectifiers. Such measurements, however, are subject to repeatability issues. Moreover, this technique is susceptible to error resulting from pathological data patterns devoid of high-frequency content, and is also sensitive to offsets in the filter and rectifier circuits as well as variations in the input signal amplitude, which are other sources of errors.

A solution to these issues is thus desirable.

SUMMARY

In an example, data transition tracking circuitry comprises an averaging circuit, a selection circuit coupled to the averaging circuit, and comparator circuitry coupled to the selection circuit. The averaging circuit receives signals indicative of respective time-averaged data transition measurements with respect to a sequence of data units, averages the received signals at a set time interval for N intervals to generate N averaged signals, where N is an integer of 2 or more. The selection circuit receives the N averaged signals, and determines, stores and outputs a maximum signal representing a maximum of the N averaged signals. The comparator circuitry receives the maximum signal and compares the maximum signal with each of a first threshold and a second threshold and output resultant signals indicative of the comparisons.

In an example, a system comprises data transition tracking circuitry, an equalizer, and a state machine. The data transition tracking circuitry receives a deserialized sequence of data units, determines a maximum data transition density (DTD) value of every N averaged DTD measurements with respect to the sequence of data units, and outputs a DTD lock signal with respect to each maximum DTD value, where N is an integer of 2 or more. The data transition tracking circuitry also determines a maximum single-bit transition (SBT) value of every N averaged SBT measurements with respect to the sequence of data units, and outputs an SBT lock signal with respect to each maximum SBT value. The equalizer has a plurality of equalization level settings, and the state machine changes the equalization level setting based on the DTD lock signals and the SBT lock signals.

In an example, a method comprises initializing a system to start at a set clock rate and a set level of equalization; measuring data transition density (DTD) for each of sequential segments of data units to generate DTD counts, each DTD count indicating a number of data transitions in the corresponding segment of data units; measuring single-bit transition (SBT) for each of the sequential segments of data units to generate SBT counts, each SBT count indicating a number of single-bit transitions in the corresponding segment of data units; determining a level of equalization based on the DTD counts and the SBT counts; and detecting a data rate based on the DTD counts and the SBT counts.

These and other features will be better understood from the following detailed description with reference to the accompanying drawings.

BRIEF DESCRIPTION OF THE DRAWINGS

Features of the disclosure may be understood from the following figures taken in conjunction with the detailed description.

FIG. 6 is a table showing example DTD counts and SBT counts for different communication channel (e.g., cable) lengths and corresponding equalization (EQ) levels in the context of an equalization setting example.

FIG. 7 is a table showing example DTD counts and SBT counts for different communication (e.g., cable) lengths and corresponding EQ levels in the context of a data rate detection example.

The same reference numbers and other reference designators are used in the drawings to designate the same or similar (structurally and/or functionally) features.

DETAILED DESCRIPTION

Figure 1:
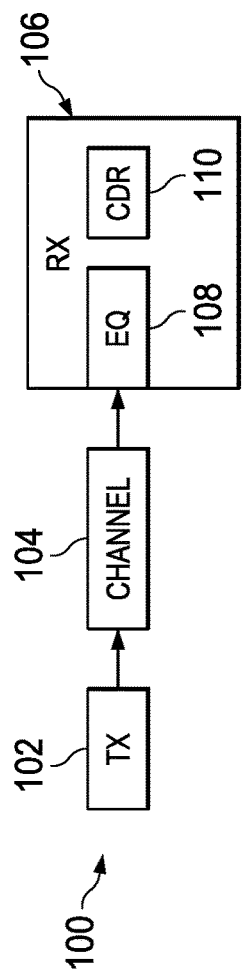
FIG. 1 is a diagram of an example communication system including a transmitter, communication channel and receiver.

Specific examples are described below in detail with reference to the accompanying figures. These examples are not intended to be limiting. The objects depicted in the drawings are not necessarily drawn to scale.

In example arrangements, a digital implementation is employed to track data transition density (DTD) and single-bit transition (SBT) occurrences in deserialized data, process such information to immunize analysis and system control from pathological patterns of data, and use the processed information to determine a level of equalization and an incoming data rate. In re-timer/re-clocker applications, the data input to a deserializer may be obtained by sampling data output from an equalizer using a clock signal from a clock and data recovery (CDR) circuit. In a re-timer digital implementation example, a free running voltage-controlled oscillator (VCO), which may be disposed within the CDR circuit, may be used in connection with the tracking, analysis and control to provide fast and reliable sub-rate detection and coarse equalization adaptation; thus, it is not necessary to wait for the CDR circuit to lock. In an example, the digital implementation employs averaging and maximizing operations on the DTD and SBT measurements to immunize the analysis and system control from pathological patterns of data. Moreover, using rail-to-rail swings of the deserialized output in the digital implementation increases robustness over conventional analog energy-based techniques as such swings make the analysis less sensitive to varying input amplitudes, offsets, noise, and other impairments.

FIG. 1 is a diagram showing a communication system 100 that includes transmitter 102 that outputs a signal, e.g., a high-speed signal, that propagates through a communication channel 104, which may be a cable or a trace on a PCB, to a receiver 106. Each of transmitter 102 and receiver 106 may be any of various electronic devices. For example, transmitter 102 may be a mobile phone and receiver may be a personal computer.

As previously noted, the signal exiting channel 104 may be distorted relative to the signal entering the channel. As the high-speed signal propagates, channel 104 may act as a low-pass filter to attenuate higher frequency content of the signal as a function of frequency, thus distorting the signal. Thus, distortion compensation circuitry, which may include an equalizer 108 and a CDR 110, which is typically embodied in receiver 106 (as shown) or may be disposed upstream thereof, to remove at least some of the distortion in the signal exiting channel 104 and output a signal for use by receiver 106 (or other components thereof) that is closer to the signal output by transmitter 102. Equalizer 108 typically includes high-pass filter functionality to compensate for the low-pass filtering of channel 104, and CDR circuit 110 may retime the equalized signal to remove jitter and other signal distortion, in which case a retimed signal is delivered to receiver 106 (or other components thereof).

A problem with conventional distortion compensation circuitry is that one or both of equalizer 108 and CDR circuit 110 may malfunction or function unreliably in the presence of certain sequences or patterns of data. Convention distortion compensation circuitry is designed to operate reliably in the presence of random or pseudo-random, e.g., scrambled data. A pathological pattern or disruptive pattern in a sequence of data units (such as a sequence of bits), however, may present problems for conventional distortion compensation circuitry. Pathological or disruptive patterns of data include, but are not limited to, a relatively lengthy sequence of identical 1's or 0's, and data that mimics a clock signal with an alternating pattern of 1's and 0's. In a digital video application, an example pathological pattern may be a single 0 followed by 19 1's, or vice versa, which pattern may represent a color such as magenta.

A pathological pattern of data units (e.g., bits) may cause various problems in operation of equalizer 108 and/or CDR circuit 110. For example, a pathological pattern may cause increased jitter that in turn causes CDR circuit 110 to lose lock, thereby preventing data recovery. In another example, a pathological pattern may cause equalizer 108 to lose its current settings, which may cause noise and resultant errors in the recovered data. Even worse, a pathological pattern may cause equalizer 108 to fail, which also prevents data recovery.

Figure 2:
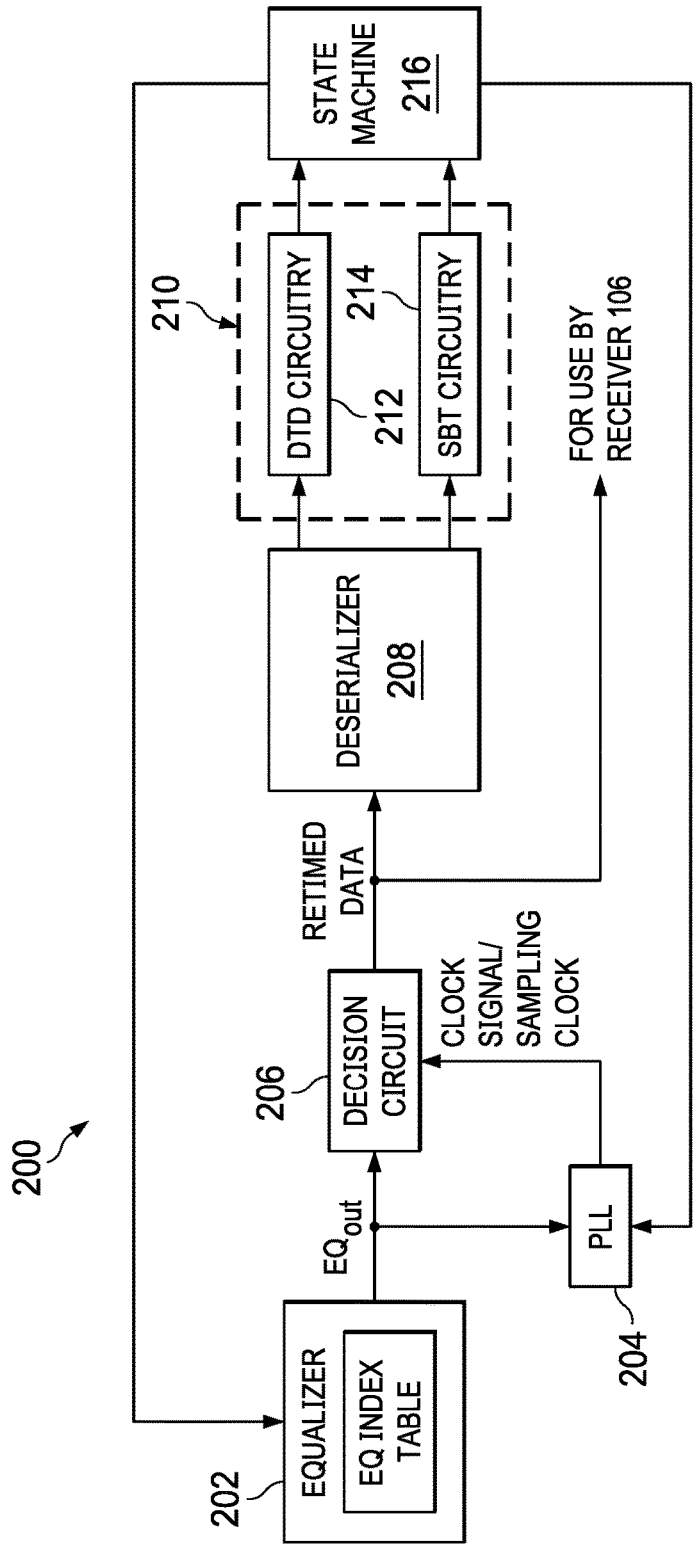
FIG. 2 is a diagram of example distortion compensation circuitry that includes data transition density (DTD) circuitry and single-bit transition (SBT) circuitry, which may be used in a re-timer application.

FIG. 2 depicts improved example distortion compensation circuitry 200 implemented in a re-timer application to detect and set an equalization level and detect an incoming data rate (without any prior knowledge thereof) across a range of communication channel (e.g., cable) lengths, even in the presence of one or more pathological patterns of data units.

In the context of a re-timer application, distortion compensation circuitry 200 includes an equalizer 202 and a CDR circuit 204 implemented as a phase-locked loop (PLL). Equalizer 202 may include a continuous time linear equalizer (CTLE) and a decision feedback equalizer (DFE) with one or more taps. Equalizer 202 may have various settings represented by respective indices (e.g., 0, 1, 2, . . . , 10) in an equalization (EQ) index table, each setting (index) representing a particular combination of a continuous time linear equalizer (CTLE) value and values for the respective DFE taps. The equalized signal ($EQ_{out}$) output by equalizer 202 is delivered to CDR circuit 204 where a phase error in $EQ_{out}$ is monitored relative to the frequency of a local voltage-controlled oscillator (VCO), or fraction thereof, to adjust the clock signal/sampling clock that is output to a decision circuit 206 which also receives $EQ_{out}$.

Decision circuit 206, of distortion compensation circuitry 200, determines, at given points in time, whether the data in $EQ_{out}$ is a low level (e.g., 0) or a high level (e.g., 1). In this sense, decision circuit 206 operates as a data extractor or sampler. Decision circuit 206 uses the clock signal from CDR circuit 204 to retime the equalized signal to eliminate or reduce timing alignment error and thereby produce a retimed signal (retimed data). Decision circuitry 206 may include lock detection circuitry to determine when CDR circuit 204 has achieved lock on the equalized signal $EQ_{out}$ by comparing the frequency and phase of $EQ_{out}$ to the frequency and phase of the clock signal from CDR circuit 204. Before CDR lock is achieved, the retimed signal (retimed data) is provided to deserializer 208 and then to data tracking circuitry 210. Once CDR lock is achieved, the retimed data is provided to receiver 106 for use and/or further processing.

Distortion compensation circuitry 200 also includes data transition tracking circuitry 210 that is used to detect pathological patterns in the data units output by deserializer 208, and based on such detection and subsequent processing, distortion compensation circuitry 200 determines a level of equalization and the incoming data rate. In an example, data transition tracking circuitry 210 measures and tracks two data metrics: data transition density (DTD) and single-bit transition (SBT) occurrences. DTD is measured as the number of data unit (e.g., bit) transitions in a given number of data units, which may be expressed as a ratio. SBT is measured as the number of single-bit transitions (010 or 101) in a given number of bits. In an example implementation, DTD and SBT are measured every 960 bits. The DTD measurements are then averaged, as are the SBT measurements.

To perform such measurements, data transition tracking circuitry 210 includes DTD circuitry 212 and SBT circuitry 214. Each of DTD circuitry 212 and SBT circuitry 214 employs averaging and maxing operations to immunize the equalization and data rate determinations from negative affects caused by pathological patterns. The outputs of DTD circuitry 212 and SBT circuitry 214 are input to a state machine 216, which uses such outputs to control CDR circuit 204 and equalizer 202, i.e., to ramp through the indices of the EQ index table, of equalizer 202.

Figure 3:
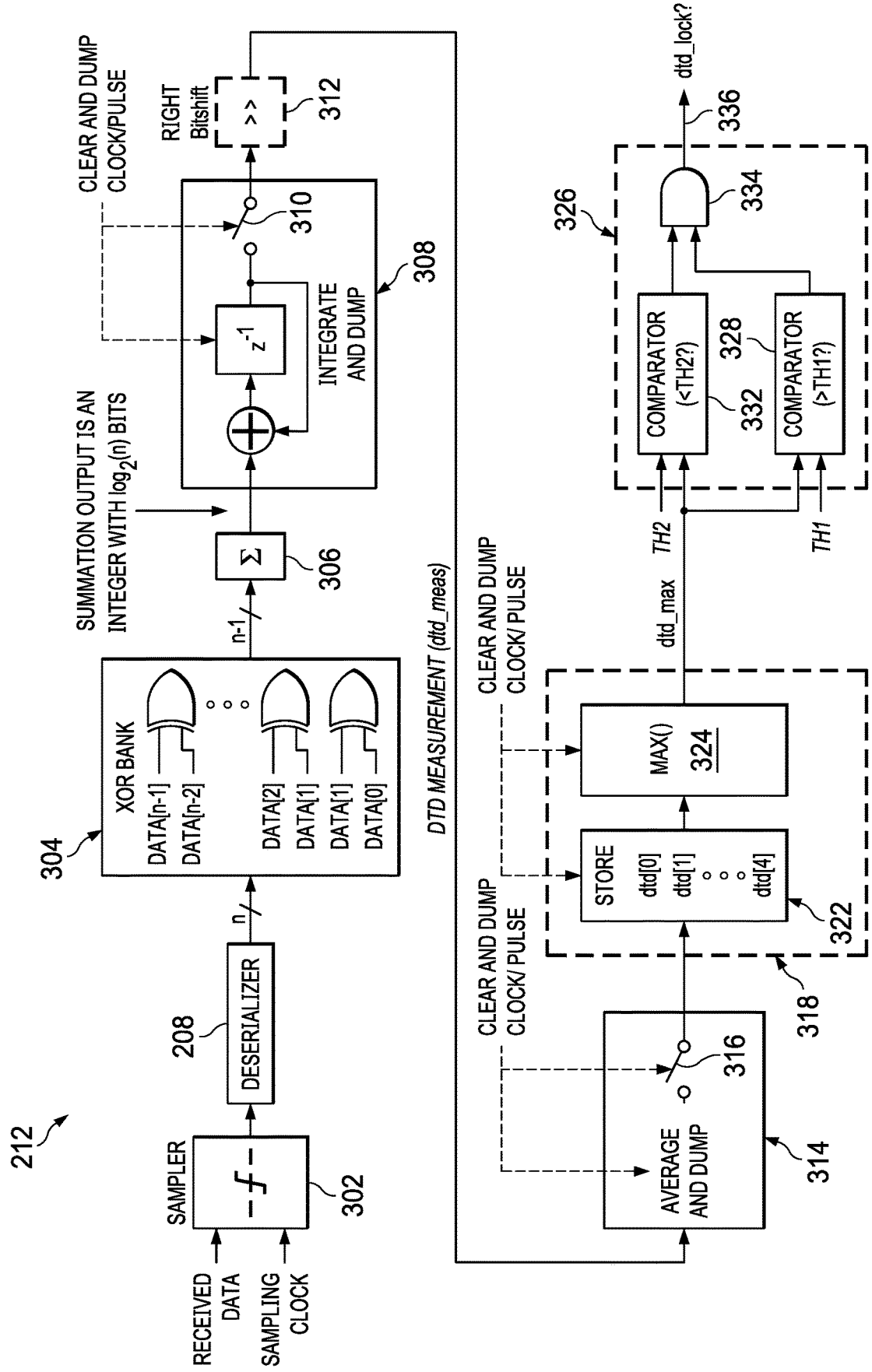
FIG. 3 is a diagram of example DTD circuitry.

FIG. 3 is a diagram of an example digital implementation of DTD circuitry 212. Such circuitry 21 includes a sampler 302 that extracts samples of data from received data. In a re-timer application, sampler 302 also receives a phase-aligned sampling clock signal from a clock generator that may be a local voltage-controlled oscillator (VCO) within a CDR circuit (e.g., CDR circuit 204) of a re-timer circuit. In an example, sampler 302 samples the received data (which may be the output of equalizer 202) at each rising edge, each falling edge, or at each clock edge (rising and falling), and outputs resultant data. Sampler 302 may be implemented any suitable way, e.g., using a buffer amplifier, an operational amplifier, a switch (such as a transistor) coupled between an output of the buffer amplifier and an input of the operational amplifier, and a capacitor coupled to the input of the operational amplifier.

In an example in which the received data is provided at about 10 Gb/s, every 100 picoseconds (e.g., 1-unit interval (UI) or 1 period of 10 Gb data), sampler 302 samples the center of the data on the rising edge of the sampling clock signal to output a new bit of data. Deserializer 208 parallelizes the serial data stream output by sampler 302 into multiple, i.e., n, slower data streams, which are then processed in the digital domain. In other examples, the incoming data rate may be different, e.g., 270 Mb/s to 12 Gb/s, or even higher such as 50 Gb/s, 100 Gb/s or higher.

In an example, deserializer 208 includes multiple shift registers configured as serial-in, parallel out (SIPO). In an example application, e.g., digital video, n=64. In other examples, n may be other values such as 32. Accordingly, deserializer 208 receives n sequential bits from the serial data stream and outputs the data onto n respective lines. The sampling clock signal may also be input to deserializer 208 where it gets divided down by n to which each of the n parallel output bits are timed. Thus, each of the n lines of data output by deserializer 208 is n times slower than the serial data stream it received.

DTD circuitry 212 also includes digital logic circuitry 304 having an input coupled to the output of deserializer 208, a summer 306 having an input coupled to an output of digital logic circuitry 304, and an integrate and dump circuit 308 having an input coupled to an output of summer 306.

In an example, digital logic circuitry 304 is implemented as an XOR bank. Then parallel bits output by deserializer 208 are input to n−1 XOR gates, where each bit is XORed with a preceding bit. Thus, for n signals input to digital logic circuitry 304, n−1 signals are output.

Summer 306 receives and combines the n−1 signals into a single signal of integer values, each having $\log_2(n)$ bits, i.e., 6 bits when n=64. In the n=64 example, the single signal output by summer 306 ranges from 0 to 63, and the integer value of the summer output signal may be updated at a rate of 1/64 the original data rate, every deserializer clock edge.

The output signal of summer 306 is provided to an integrate and dump circuit 308, which provides a time-averaged DTD measurement signal. Integrate and dump circuit 308 includes an accumulator having an adder, denoted by 0, coupled to summer 306 to receive its output, and a $z^{-1}$ register that receives the output of the adder and delays it by one clock cycle. The adder and $z^{-1}$ register are configured in a feedback loop in which the output of the $z^{-1}$ register is fed back to the adder. Integrate and dump circuit includes a switch 310 having one terminal selectively couplable to the output of the $z^{-1}$ register and the other terminal coupled to an input of a right bitshift 312. The sum of the signal output by summer 306 and the signal from the $z^{-1}$ register are accumulated in the $z^{-1}$ register until a clear and dump clock edge or pulse is provided to the $z^{-1}$ register and switch 310. Assertion of the clock edge or pulse closes switch 310, causes the current accumulated sum to be output from integrate and dump circuit 308 as the DTD measurement, and clears the $z^{-1}$ register. Switch 310 is then reopened again to restart the accumulator until another clock edge or pulse is provided.

Right bitshift 312 may be used to truncate the least significant bits (LSBs) to remove noise from the time-averaged DTD signal output from integrate and dump circuit 308, before providing the DTD signal to an average and dump circuit 314. If right bitshift 312 is not used, the output of integrate and dump circuit 308 is provided directly to average and dump circuit 314. The time-averaged DTD signal is indicative of the number of data transitions in a given number of bits.

Average and dump circuit 314 of DTD circuitry 212 receives the (LSB-truncated) time-averaged DTD measurements (signals) and averages them. In an example, average and dump circuit 314 averages the DTD measurements every x μs over N intervals, where x and N are selected such that x*N exceeds the duration of each pathological pattern that may appear. A clear and dump clock edge or pulse is provided each time an average DTD value is determined, at which time switch 316 is closed to output an average DTD measurement to a selection circuit 318, and to clear the entries in average and dump circuit 314.

Selection circuit 318 of DTD circuitry 212 includes a storage 322 where N averaged DTD measurements are stored, and a selector 324 that selects a maximum value among the N averaged DTD measurements in storage 322. Storage 322 and selector 324 are controlled by clear and dump clock edges or pulses. The maximum value of the N averaged DTD measurements (dtd_max) represents a count of data transitions.

The maximum value (dtd_max) selected by selector 324 is provided to comparator circuitry 326 of DTD circuitry 212. Comparator circuitry 326 may include a first comparator 328, a second comparator 332, and an AND logic gate 334. One input of each of first and second comparators 328 and 332 is coupled to the output of selector 324 to receive the maximum value signal (dtd_max). Another input of first comparator 328 is configured to receive lower threshold (TH1), and another input of second comparator 332 is configured to receive an upper threshold (TH2). The thresholds TH1 and TH2 may be programmed into a register or some other memory device (not shown) that is coupled to comparator circuitry 326. Outputs of comparators 328 and 332 are coupled to respective inputs of AND gate 334. A trigger signal 336 (dtd_lock?) is provided at the output of AND gate 334.

First comparator 328 determines whether the maximum value (dtd_max) is greater than lower threshold TH1, and if so, asserts a high signal (e.g., 1) when dtd_max is greater than TH1. Second comparator 332 asserts a high signal (e.g., 1) when its comparison indicates that dtd_max is less than upper threshold TH2. When both comparators 328 and 332 assert a high signal (e.g., 1), AND gate 334 also asserts a high signal (e.g., 1), indicating that the maximum value (dtd_max) is within a range defined by TH1 at the lower end and TH2 at the upper end. Otherwise, if either or both of comparators 328 and 332 assert a low signal, output signal 336 of AND gate 334 likewise goes low, indicating that dtd_max is not within the set range defined by TH1 and TH2.

Figure 4:
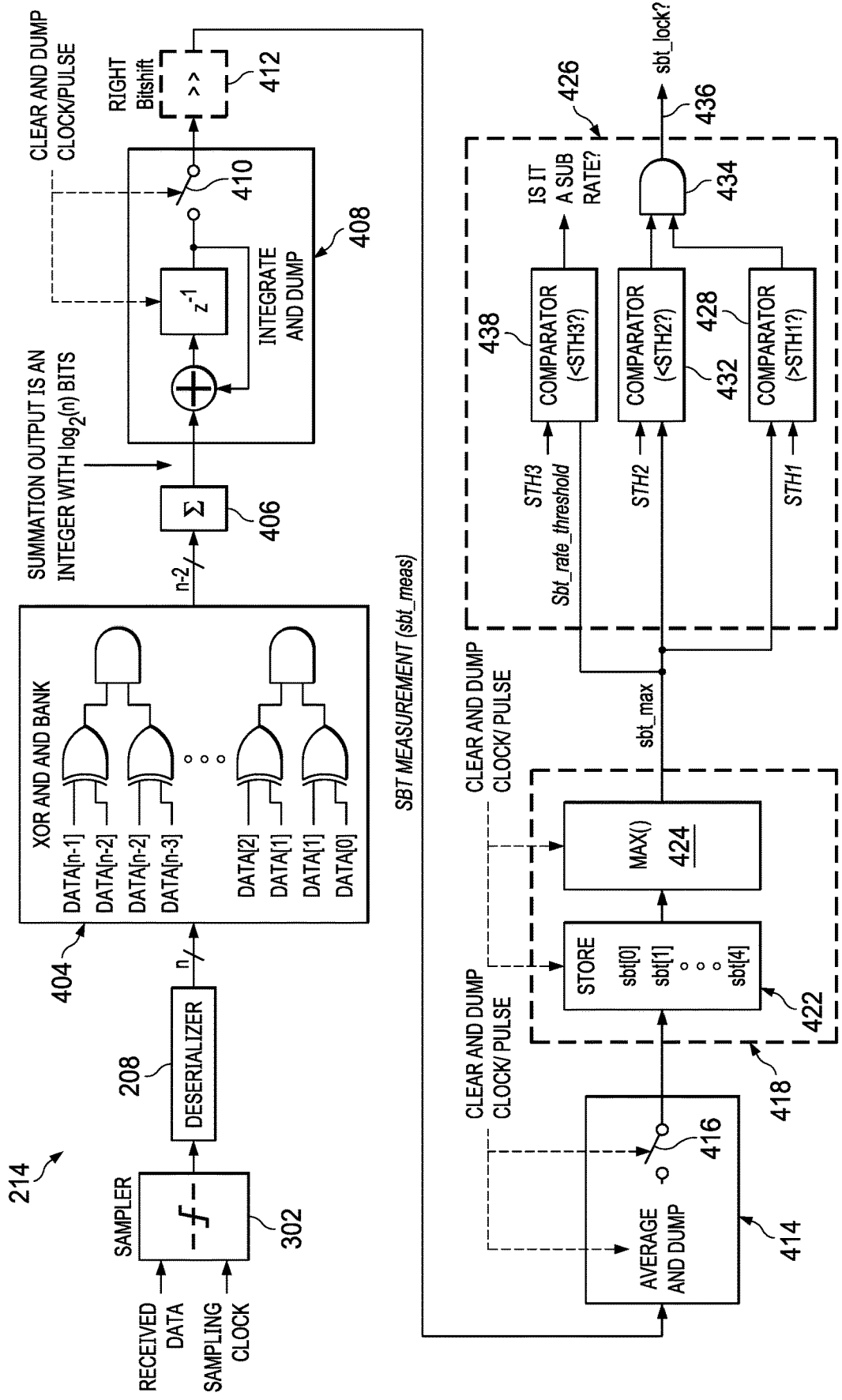
FIG. 4 is a diagram of example SBT circuitry.

FIG. 4 is a diagram of an example digital implementation of SBT circuitry 214. Such circuitry 214 includes sampler 302, and deserializer 208, which may be the same as those used with DTD circuitry 212. SBT circuitry 214 also includes digital logic circuitry 404 having an input coupled to the output of deserializer 208, a summer 406 having an input coupled to an output of digital logic circuitry 404, and an integrate and dump circuit 408 having an input coupled to an output of summer 406.

In an example, digital logic circuitry 404 is implemented as an XOR and an AND bank. The n parallel bits output by deserializer 208 are input to n−1 XOR gates, where each bit is XORed with a preceding bit. The XOR gates are arranged in pairs as shown, and the outputs of each XOR gate of a given pair is input to a corresponding AND gate. Thus, for n signals input to digital logic circuitry 404, n−2 signals are output.

Summer 406 receives and combines the n−2 signals into a single signal of integer values, each having $\log_2(n)$ bits, i.e., 6 bits when n=64. In the n=64 example, the single signal output by summer 406 ranges from 0 to 62, and the integer value of the summer output signal may be updated at a rate of 1/64 the original data rate, every deserializer clock edge.

The output signal of summer 406 is provided to an integrate and dump circuit 408, which provides a time-averaged SBT measurement signal. Integrate and dump circuit 408 of SBT circuitry 214 is configured substantially the same as integrate and dump circuit 308 of DTD circuitry 212. The sum of the signal output by summer 406 and the fed back signal from the $z^{-1}$ register are accumulated in the $z^{-1}$ register until a clear and dump clock edge or pulse is provided to the $z^{-1}$ register and switch 410. The clock edge or pulse closes switch 410, causes the current accumulated sum to be output from integrate and dump circuit 408 as the SBT measurement, and clears the $z^{-1}$ register. Switch 410 is then reopened again to restart the accumulator until another clock edge or pulse is provided.

Right bitshift 412 may be used to truncate the least significant bits (LSBs) to remove noise from the time-averaged SBT signal output from integrate and dump circuit 408, before providing the SBT signal to an average and dump circuit 414. If right bitshift 412 is not used, the output of integrate and dump circuit 408 is provided directly to average and dump circuit 414. The time-averaged SBT signal is indicative of the number of data transitions in a given number of bits.

Average and dump circuit 414 of SBT circuitry 214 receives the (LSB-truncated) time-averaged SBT measurements (signals) and averages them. In an example, average and dump circuit 414 averages the SBT measurements every x μs over N intervals, where x and N are selected such that x*N exceeds the duration of each pathological pattern that may appear. A clear and dump clock edge or pulse is provided each time an average SBT value is determined, at which time switch 416 is closed to output an average SBT measurement to a selection circuit 418, and to clear the entries in average and dump circuit 414.

Selection circuit 418 includes a storage 422 where N averaged SBT measurements are stored, and a selector 424 that selects a maximum value from among the N averaged SBT measurements in storage 422. Storage 422 and selector 424 are controlled by clear and dump clock edges or pulses. The maximum value of the average SBT measurements (sbt_max) represents a count of single-bit transitions.

The maximum value (sbt_max) selected by selector 424 is provided to comparator circuitry 426 of SBT circuitry 214. Comparator circuitry 426 may include a first comparator 428, a second comparator 432, a third comparator 438 and an AND logic gate 434. One input of each of first and second comparators 428 and 432 is coupled to the output of selector 424 to receive the maximum value signal (sbt_max). Another input of first comparator 428 is configured to receive lower threshold (STH1), and another input of second comparator 432 is configured to receive an upper threshold (STH2). The thresholds STH1 and STH2 may be programmed into a register or some other memory device (not shown) that is coupled to comparators 428 and 432. Thresholds STH1 and STH2 are not necessarily the same as their counterpart thresholds TH1 and TH2, respectively, used in DTD circuitry 212. Outputs of comparators 428 and 432 are coupled to respective inputs of AND gate 434. A trigger signal 436 (sbt_lock?) is provided at the output of AND gate 434.

First comparator 428 determines whether the maximum value (sbt_max) is greater than lower threshold STH1, and if so, asserts a high signal (e.g., 1) when sbt_max is greater than STH1. Second comparator 432 asserts a high signal (e.g., 1) when its comparison indicates that sbt_max is less than upper threshold STH2. When both comparators 428 and 432 assert a high signal (e.g., 1), AND gate 434 also asserts a high signal (e.g., 1), indicating that the maximum value (sbt_max) is within a range defined by TH1 at the lower end and TH2 at the upper end. Otherwise, if either or both of comparators 328 and 332 assert a low signal, output signal 436 of AND gate 434 likewise goes low, indicating that sbt_max is not within the set range defined by TH1 and TH2.

Third comparator 438 is used to compare the maximum value (sbt_max) with a lowest threshold (STH3) to determine whether the incoming data rate is a sub-rate.

Figure 5:
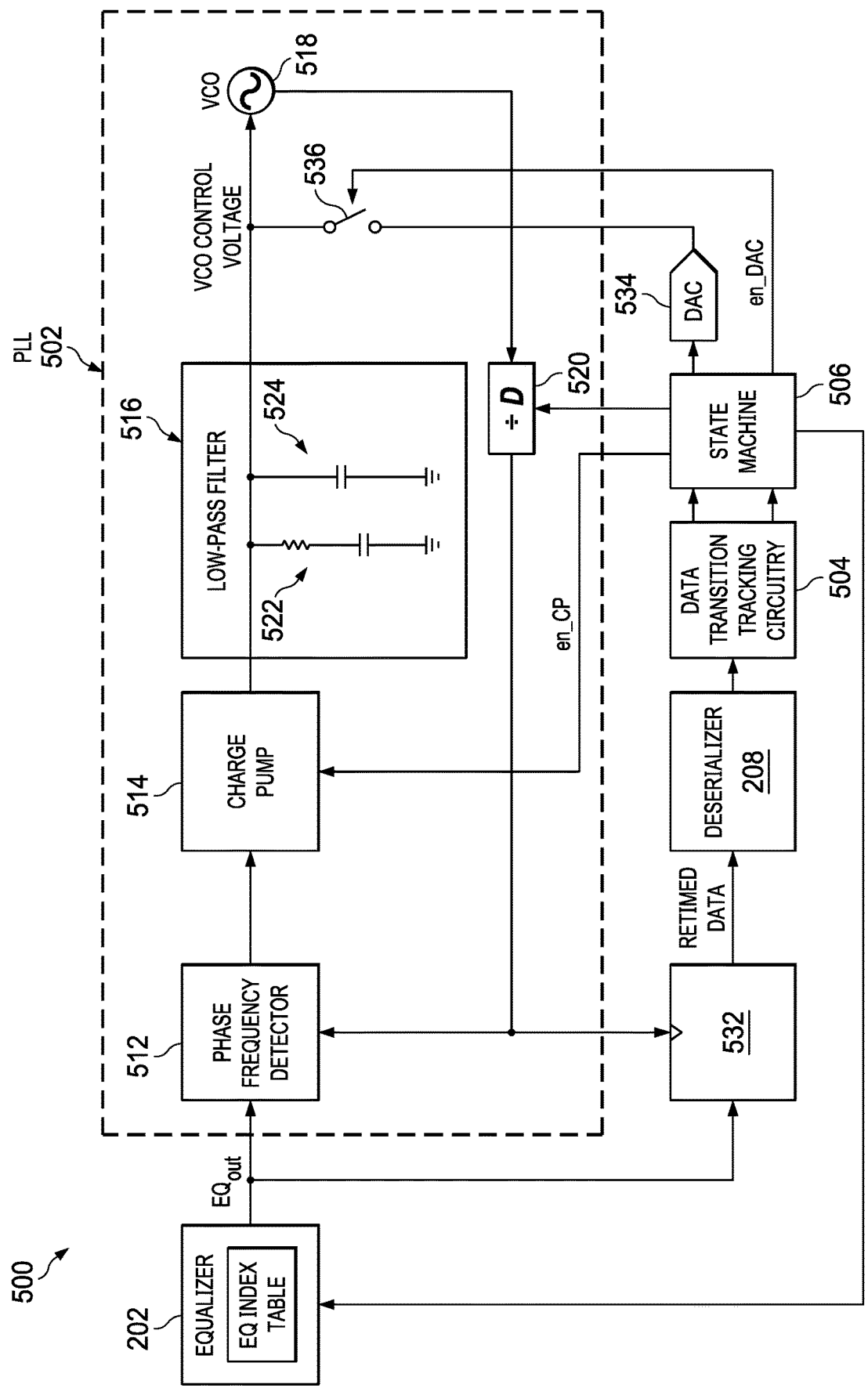
FIG. 5 is a diagram of a system including distortion compensation circuitry in a re-timer application to determine a level of equalization and detect the rate of incoming data.

DTD and SBT circuitry 212 and 214 may be implemented as part of a system, such as system 500 shown in FIG. 5. Example system 500, which may be used in a re-timer application, includes a clock and data recovery (CDR) circuit implemented as a phase-locked loop (PLL) 502, distortion compensation circuitry 504, and a state machine 506 to control CDR 502 and to ramp through the indices (settings) in the equalization table of equalizer 202 during the process of determining a level of equalization and detecting the incoming data rate.

The PLL-implemented CDR circuit 502 includes a phase frequency detector 512, a charge pump 514, a low pass filter 516, and a voltage-controlled oscillator (VCO) 518 coupled as illustrated. Low pass filter 516 includes a resistor-capacitor branch 522 and a capacitor branch 524, each coupled at one end between the input and output of low pass filter 516 and at the other end to ground. CDR circuit 502 may also include a frequency divider (±D) 520 that divides the frequency of the clock signal output by VCO 518 by a factor of D. System 500 also includes a decision circuit 532, which may function as a data extractor or sampler. Decision circuit 532 receives the output ($EQ_{out}$) from equalizer 202 and the locally-generated clock signal output by VCO 518 (or multiple thereof) and retimes $EQ_{out}$ to generate retimed data that is input to deserializer 208 during the process of setting an equalization level and detecting the incoming data rate.

The deserialized data is input to data transition tracking circuitry 504, which may be the same as data transition tracking circuitry 210 shown in FIG. 2. Thus, distortion compensation circuitry 504 includes DTD circuitry 212 and SBT circuitry 214, each of which receives the output of deserializer 208. To this end, deserializer 208 may have two outputs respectively coupled to DTD circuitry 212 and SBT circuitry 214 (as shown), or a single output coupled to both such circuitry.

System 500 further includes a digital-to-analog converter (DAC) 534 that is selectively couplable to the node between the output of low pass filter 516 and the input of VCO 518 via a switch 536 that is controlled by state machine 506. Switch 536 is configured to close when state machine 506 asserts an enable DAC signal (en_DAC). State machine 506 also controls the output of DAC 534 when enabled. State machine 506 also controls activation of charge pump 514 via an enable charge pump signal (en_CP).

VCO 518 may operate at or near 12 GHz, and D, which is a positive integer, may be varied by state machine 506 accordingly to support various data rates. The following table provides some examples.

| Date Rate | VCO Rate | D |
|---|---|---|
| 12 GHz | 12 GHz | 1 |
| 6 GHz | 12 GHz | 2 |
| 3 GHz | 12 GHz | 4 |
| 1.5 GHz | 12 GHz | 8 |
| 270 MHz | 10.8 GHz | 40 |

During equalization setting (adaptation) and rate detection, charge pump 514 is disabled, i.e., charge pump enable signal (en_CP) is de-asserted at logic low value 0, and DAC 534 is enabled, i.e., the DAC enable signal (en_DAC) is asserted at logic high value 1. Thus, switch 536 is closed during this time, and the VCO control voltage is controlled by DAC 534. In an example, DAC 534 is controlled by state machine 506 to set the VCO control voltage to approximately 0.5 V. During equalization setting and rate detection, state machine 506 ramps through the equalization indices (representing settings) of equalizer 202 based on the outputs of DTD circuitry 212 and SBT circuitry 214 to determine a coarse equalization setting and detect the rate of the incoming data.

The table of FIG. 6 shows example DTD counts and SBT counts at various indices of an equalization index table in a simulation with the incoming data at 12 Gb/s and with the re-timer's free-running VCO (e.g., VCO 518) operating at about 12.3 GHz to determine an equalization level. The data becomes more optimally equalized as the DTD count increases above 400 and as the SBT count increases above 180. These thresholds are selected to achieve sufficient equalization for the CDR circuit (e.g., CDR circuit 502) to lock comfortably. Thus, by ramping through the equalization index table and by analyzing DTD and SBT, a coarse equalization setting can be quickly identified for any of various communication channel (e.g., cable) lengths.

The table of FIG. 7 shows example DTD counts and SBT counts at various indices of an equalization index table in a simulation with the incoming data at 6 Gb/s and the re-timer's free-running VCO (e.g., VCO 518) operating at about 12.3 GHz to determine the incoming data rate. Here, as the data becomes more optimally equalized, resulting from a low number of single-bit transitions as the clock rate is higher than the data rate, the SBT count drops below 10. Thus, by ramping through the equalization index table and by analyzing SBT, the incoming data rate can be quickly identified. Here, DTD does not even get close to the 400-count limit set for the equalization level determination shown in FIG. 6, which is also due to the lower data rate, hence indicating effectively lower transition density.

Once a level of equalization is determined (coarse equalization) and the incoming data rate is detected, CDR circuit 502 attempts to lock. Once CDR circuit 502 locks, charge pump 514 is enabled, i.e., charge pump enable signal (en_CP) is asserted at logic level 1, and DAC 534 is disabled, i.e., DAC enable signal (en_DAC) is de-asserted at logic level 0. Thus, charge pump 514 generates the VCO control voltage during this time.

Figure 8:
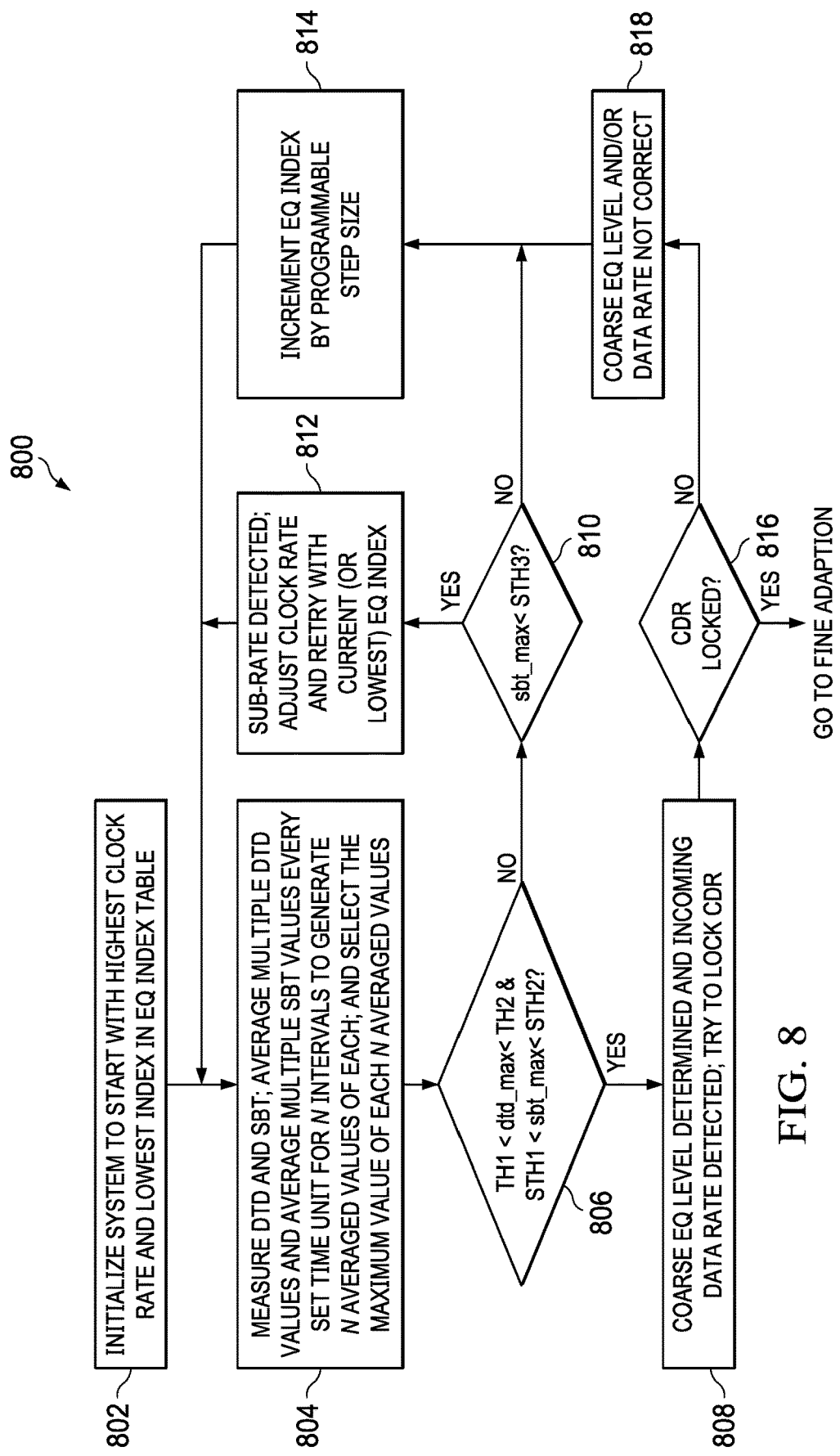
FIG. 8 is a flow diagram of an example method of operating a system to determine an equalization level and to detect the rate of incoming data.

FIG. 8 is a flow diagram of an example method/process 800 of operating an example system (e.g., system 500) to determine an equalization level and to detect the rate of incoming data. For example, method 800 may be implemented in the circuitry (or portions thereof) shown in FIGS. 2-5.

At operation 802, the system is initialized to start at a select index in the equalization (EQ) index table and highest clock rate. The starting index may be zero, or any other suitable index. The starting index may be programmable through registers. For example, in an application using a long channel, the user may program the starting index to be a reasonable non-zero value for fast coarse adaptation and rate detection. The EQ index table may have a combination of CTLE and DFE settings, or some CTLE-only settings and other combination CTLE+DFE settings. For example, each setting (index) in the EQ index table may be a unique combination of a CTLE value and three DFE tap values. In another example, each setting of a first group of settings may be defined by a CTLE value only, and each setting of a second group of settings may be a combination of a CTLE value and one or more DFE tap values. In an example, the EQ index table has ten settings (indices).

In operation 804, DTD and SBT are measured. Every set time unit (e.g., x μs) DTD measurements are averaged, as are SBT measurements, and such averaging is done over N intervals to generate N averaged DTD values and N averaged SBT values. Among the N averaged DTD values, a maximum value (dtd_max) is selected. Similarly, among the N averaged SBT values a maximum value (sbt_max) is selected.

The equalization index is incremented until one of two conditions are met (e.g., as determined by comparator circuitry 326 and 426). The first condition entails the following comparisons in operation 806: is dtd_max greater than lower threshold TH1 and less than upper threshold TH2, and is sbt_max greater than lower threshold STH1 and less than upper threshold STH2. If both of these statements are true (Yes at operation 806), which result may be indicated, e.g., by a high signal from each of AND gate 334 and 434, flow moves to operation 808 in which coarse equalization is determined and the incoming rate is detected; CDR locking is also attempted. The second condition, which is considered when one or both of the statements of the first condition is false (No at operation 806), entails determining in operation 810 (e.g., using comparator 438) whether sbt_max is less than threshold STH3. If true (Yes at operation 810), this means that a sub-rate was detected and that the clock rate is incorrect, in which case the clock rate is changed (e.g., by changing D of frequency divider 520 and/or changing the setting of VCO 518) in operation 812. Typically, when a sub-rate is detected that means that the clock rate is a multiple of, or much larger than, the data rate, due to the absence of single-bit transitions, thus D is increased to decrease the clock rate. After that, the process returns to operation 804 in which DTD and SBT measurements are again made.

At this juncture, such measurements may be made at the current equalization setting, which may be the lowest. Also, measurements may be repeated multiple times for increased confidence, and when consistent, may be repeated yet again at the next lower clock rate.

When neither of the conditions of operations 806 and 810 are true (No at both operations), the process moves to operation 814 in which the equalization setting index is incremented by a programmable step size, which may be 1. Thereafter, the process returns to operation 804.

Returning to operation 808 in which CDR locking is attempted, at this time the charge pump is enabled (e.g., charge pump 514 is enabled via assertion of en_CP signal) and the DAC is disabled (e.g., DAC 534 is disabled via de-assertion of en_DAC signal to open switch 536). With this configuration, it is determined in operation 816 whether such locking has occurred. If so (Yes at operation 816), coarse equalization has been determined and the incoming data rate detected. Further finer adaption may then be carried out using any of various techniques. For example, the coarse equalization setting index may be used as a starting point for sign-sign least-mean-squares (SS-LMS) continuous adaptation. That is, in an example, CDR lock triggers execution of an SS-LMS algorithm to achieve the best bit error rate (BER).

If CDR-locking has not occurred (No at operation 816), that means that one or both of coarse equalization and rate detection is not correct, as indicated in block 818. In that case, the process returns to operation 814.

FIG. 8 depicts one possible set and order of operations. Some operations may be combined or performed substantially simultaneously. Additional operations may be performed as well.

Various examples of systems, circuitry and methods use multiple data transition metrics, e.g., maximums of averaged DTD and SBT measurements, to determine the level of equalization and incoming data rate. In an example, such determinations are made using circuitry that analyzes deserialized data (from sampled received or input data) to determine DTD and SBT values. To gain immunity to pathological patterns, DTD and SBT measurements are averaged every x µs for N intervals, and the maximum of N averaged values, dtd_max and sbt_max, are stored and used for analysis and control. The values of x and N are selected such that the x*N exceeds the duration of any pathological pattern, such that the effect of low-density pathological data patterns on the DTD and SBT values is removed when using the averaging and maximizing operations.

In examples, two thresholds are defined for each of the dtd_max and sbt_max outputs. When both of these maximum values are within the range defined by their respective threshold pairs, that indicates sufficient equalization at the correct data rate. When the data is underequalized, the maximum values remain below their lowest threshold due to incomplete transitions due to intersymbol interference (ISI) or dispersion. In an example, the processing and analysis begins at the highest clock rate (using a free-running VCO in the CDR circuit) and at the lowest index in the equalization index table. The index is incremented via a state machine until sufficient equalization is determined. A third sub-rate threshold is defined to detect a sub-rate. In such case, the divider setting and/or the VCO setting is changed to lower the frequency of the re-timer clock.

In one simulation, with an incoming data rate of 12 Gb/s, a re-timer clock (e.g., VCO) running at ~12 GHz, a cable length of 95 m, and a non-pathological video pattern, coarse equalization was achieved in approximately 200 µs. In such simulation, coarse adaptation entailed ramping through equalization settings (indices) of two tables; first one with CTLE values only and then another in which each index is a combination of a CTLE value and DFE values. In another simulation, with an incoming data rate of 270 Mb/s, a re-timer clock (e.g., VCO) running at ~270 MHz, a cable length of 600 m, and an SDI EQ pathological data pattern, coarse equalization was achieved in approximately 2000 µs. In another simulation, with an incoming data rate of 270 Mb/s, a re-timer clock (e.g., VCO) running at ~1.5 GHz, a cable length of 550 m, and an SDI pathological video pattern, a sub-rate was detected. The simulation was started at a relatively high index (15) among 18 total indices. DTD and SBT measurements were averaged approximately every 6.4 µs. After a run at index 15 (approximately 100 µs), the equalization setting was incremented by 3. At equalization index 18, sbt_max was less than 10 (STH3: the sub-rate threshold). At this point, the process was restarted at equalization index 0, and incremented by 3 for each subsequent run. Upon reaching index 18 again, sbt_max was again less then 10 (STH3). As this was the second time a sub-rate was detected, such sub-rate was confirmed.

The term "coupled" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

An element that is "configured to" perform a task or function may be configured (e.g., programmed and/or hard-wired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the element, or a combination thereof.

As used herein, the terms "terminal" and "node" are used interchangeably and may also encompass the terms "interconnection", "pin" and "lead". Unless specifically stated to the contrary, these terms are generally used to mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements may instead include only the semiconductor elements within a single physical device (e.g., a semiconductor die and/or integrated circuit (IC) package) and may be adapted to be coupled to other elements and/or voltage or current sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. A component, unless otherwise stated, may be representative of multiple instances of components configured to perform the stated functionality.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about" or "approximately" preceding a value means +/−10 percent of the stated value.

Modifications of the described examples are possible, as are other examples, within the scope of the claims. For example, although less optimal than the digital implementation, the DTD and SBT circuitry could be implemented using analog circuits at full rate, followed by divider circuits to analyze the counts in the digital domain at a lower (divided-down) rate. Moreover, features described herein may be applied in other environments and applications consist with the teachings provided.

What is claimed is:

1. Data transition tracking circuitry, comprising:
   an averaging circuit configured to receive signals indicative of respective time-averaged data transition measurements with respect to a sequence of data units, average the received signals at a set time interval for N intervals to generate N averaged signals, where N is an integer of 2 or more;
   a selection circuit coupled to the averaging circuit to receive the N averaged signals, the selection circuit configured to determine, store and output a maximum signal representing a maximum of the N averaged signals; and
   comparator circuitry coupled to the selection circuit to receive the maximum signal and compare the maximum signal with each of a first threshold and a second threshold and output resultant signals indicative of the comparisons.

2. The data transition tracking circuitry of claim 1, wherein the comparator circuitry includes a first comparator having a first maximum signal input and a first threshold input, and a second comparator having a second maximum signal input and a second threshold input.

3. The data transition tracking circuitry of claim 2, further comprising:
   logic circuitry having a first input coupled to an output of the first comparator, a second input coupled to an output of the second comparator, and an output configured to output a signal indicative of whether the maximum signal is between the first and second thresholds.

4. The data transition tracking circuitry of claim 2, wherein the first comparator is configured to determine whether the maximum signal is greater than the first threshold, and the second comparator is configured to determine whether the maximum signal is greater than the second threshold.

5. The data transition tracking circuitry of claim 1, further comprising:
   data transition measurement circuitry configured to generate the signals indicative of the respective time-averaged data transition measurements, wherein the time-averaged data transition measurements are time-averaged data transition density (DTD) measurements.

6. The data transition tracking circuitry of claim 1, further comprising:
   data transition measurement circuitry configured to generate the signals indicative of the respective time-averaged data transition measurements, wherein the time-averaged data transition measurements are time-averaged single-bit transition (SBT) measurements.

7. The data transition tracking circuitry of claim 6, wherein the data transition measurement circuitry includes logic circuitry configured to receive deserialized data derived from the sequence of data units.

8. The data transition tracking circuitry of claim 7, wherein the data transition measurement circuitry further includes a summer circuit coupled to the logic circuitry, and an integrator circuit coupled to the logic circuitry.

9. The data transition tracking circuitry of claim 8, wherein the integrator circuit is coupled to the averaging circuit.

10. A system, comprising:
    data transition tracking circuitry configured to:
        receive a deserialized sequence of data units,
        determine a maximum data transition density (DTD) value of every N averaged DTD measurements with respect to the sequence of data units, and output a DTD lock signal with respect to each maximum DTD value, where N is an integer of 2 or more, and
        determine a maximum single-bit transition (SBT) value of every N averaged SBT measurements with respect to the sequence of data units, and output an SBT lock signal with respect to each maximum SBT value;
    an equalizer having a plurality of equalization level settings; and
    a state machine configured to change the equalization level setting based on the DTD lock signals and the SBT lock signals.

11. The system of claim 10, wherein the data transition tracking circuitry includes:
    DTD circuitry configured to receive the deserialized sequence of data units, determine the maximum DTD values, and output the DTD lock signals, and
    SBT circuitry configured to receive the deserialized sequence of data units, determined the maximum DTD values, and output the SBT lock signals.

12. The system of claim 11, wherein:
    the DTD circuitry includes first and second DTD comparators, each having a maximum DTD value input configured to receive each maximum DTD value, the first DTD comparator having a first DTD threshold input configured to receive a first DTD threshold, and the second DTD comparator having a second DTD threshold input configured to receive a second DTD threshold; and the SBT circuitry includes first and second SBT comparators, each having a maximum SBT value input configured to receive each maximum SBT value, the first SBT comparator having a first SBT threshold input configured to receive a first SBT threshold, and the second SBT comparator having a second SBT threshold input configured to receive a second SBT threshold.

13. The system of claim 11, wherein the DTD circuitry includes DTD logic having first and second inputs coupled to first and second outputs of the first and second DTD comparators respectively, the logic having an output at which signal indicative of whether a corresponding one of the maximum DTD values is within a set range is output.

14. The system of claim 11, wherein the SBT circuitry includes SBT logic having first and second inputs coupled to first and second outputs of the first and second SBT comparators respectively, the logic having an output at which a signal indicative of whether a corresponding one of the maximum SBT values is within a set range is output.

15. The system of claim 11, wherein the SBT circuitry includes a third SBT comparator having a maximum SBT value input to receive each maximum SBT value and a third SBT threshold input.

16. The system of claim 10, further comprising:
a clock and data recovery (CDR) circuit controlled by the state machine, the CDR circuit including a voltage-controlled oscillator (VCO).

17. The system of claim 10, further comprising:
a re-timer circuit controlled by the state machine, the re-timer circuit including a voltage-controlled oscillator (VCO).

18. A method, comprising:
initializing a system to start at a set clock rate and a set level of equalization;
measuring data transition density (DTD) for each of sequential segments of data units to generate DTD counts, each DTD count indicating a number of data transitions in the corresponding segment of data units;
measuring single-bit transition (SBT) for each of the sequential segments of data units to generate SBT counts, each SBT count indicating a number of single-bit transitions in the corresponding segment of data units;
determining a level of equalization based on the DTD counts and the SBT counts; and
detecting a data rate based on the DTD counts and the SBT counts.

19. The method of claim 18, wherein the measuring of the DTD comprises:
averaging measured DTD values every x time unit for N intervals to generate N averaged DTD values for a corresponding segment of data units of time length x*N; and
selecting a maximum DTD value, among the N averaged DTD values, as the DTD count for the corresponding segment of data units.

20. The method of claim 18, wherein the measuring of the SBT comprises:
averaging measured SBT values every x time unit for N intervals to generate N averaged SBT values for a corresponding segment of data units of time length x*N; and
selecting a maximum SBT value, among the N averaged SBT values, as the SBT count for the corresponding segment of data units.

21. The method of claim 18, further comprising:
attempting to lock a clock and data recovery (CDR) circuit after determining the level of equalization and detecting the data rate.

22. The method of claim 21, further comprising:
incrementing the equalization level by a step size when it is determined that the CDR circuit did not lock; and
repeating the measuring DTD and measuring SBT operations.

* * * * *